(12) United States Patent  
Armbruster et al.

(10) Patent No.: US 7,353,159 B2
(45) Date of Patent: Apr. 1, 2008

(54) METHOD FOR PARALLEL SIMULATION ON A SINGLE MICROPROCESSOR USING META-MODELS

(75) Inventors: Frank Armbruster, Boeblingen (DE); Bodo Eberhard Hoppe, Tamm (DE); Johannes Koesters, Holzgerlingen (DE); Klaus-Dieter Schubert, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 946 days.

(21) Appl. No.: 10/146,331

(22) Filed: May 15, 2002

(65) Prior Publication Data

US 2002/0173943 A1    Nov. 21, 2002

(30) Foreign Application Priority Data

May 16, 2001    (EP)    ................................ 01111833

(51) Int. Cl.
*G06F 17/50*    (2006.01)
(52) U.S. Cl. ............................ 703/15; 703/14; 714/33; 717/100; 717/135; 717/159; 717/165
(58) Field of Classification Search .................. 703/15, 703/14, 19, 22; 716/5; 717/100, 135, 159, 717/165; 714/33
See application file for complete search history.

(56) References Cited

U.S. PATENT DOCUMENTS

| | | | | |
|---|---|---|---|---|
| 5,197,016 A | * | 3/1993 | Sugimoto et al. ............... 716/8 |
| 5,363,319 A | * | 11/1994 | Okuda .......................... 703/15 |
| 5,581,562 A | * | 12/1996 | Lin et al. ..................... 714/724 |
| 5,680,584 A | * | 10/1997 | Herdeg et al. ................. 703/22 |
| 5,905,987 A | * | 5/1999 | Shutt et al. ............. 707/103 R |
| 5,970,242 A | * | 10/1999 | O'Connor et al. ........... 717/100 |
| 6,067,639 A | * | 5/2000 | Rodrigues et al. ............. 714/38 |
| 6,192,504 B1 | * | 2/2001 | Pfluger et al. .................. 716/1 |
| 6,233,540 B1 | * | 5/2001 | Schaumont et al. .......... 703/14 |
| 6,289,491 B1 | * | 9/2001 | Dupenloup ..................... 716/5 |
| 6,453,276 B1 | * | 9/2002 | Bauman ....................... 703/15 |
| 6,477,689 B1 | * | 11/2002 | Mandell et al. ............... 716/11 |
| 6,505,328 B1 | * | 1/2003 | Van Ginneken et al. ........ 716/7 |
| 6,560,721 B1 | * | 5/2003 | Boardman et al. ............. 714/33 |
| 6,591,403 B1 | * | 7/2003 | Bass et al. ..................... 716/5 |
| 6,857,110 B1 | * | 2/2005 | Rupp et al. .................... 716/4 |
| 6,874,146 B1 | * | 3/2005 | Iyengar ...................... 719/331 |
| 7,174,534 B2 | * | 2/2007 | Chong et al. ............... 717/105 |
| 2002/0038447 A1 | * | 3/2002 | Kim et al. ..................... 716/4 |
| 2003/0220780 A1 | * | 11/2003 | Fallah et al. .................. 703/21 |

(Continued)

OTHER PUBLICATIONS

A. Jantsch, J. Notbauer, and T. Albrecht, Testcase Development for Large Telecom Systems, PDF file Created on Apr. 3, 2001, pp. 1-8.*

*Primary Examiner*—Hugh Jones
*Assistant Examiner*—Kibrom K. Gebresilassie
(74) *Attorney, Agent, or Firm*—Lynn L. Augspurger

(57) ABSTRACT

The present invention generally relates to hardware development and design, and in particular it relates to a method for simulating hardware. A meta model (22) is compiled for integrating a plurality of n different instantiations (12 A, . . . 12N) of the same hardware model, and facilities and signals of different instantiations are resolved by instantiation-specific name space specifications in a code switch (24,26). Thus, computing time is saved because by simulating the meta model, the processor resources, for instance, storage spaces, are utilized more efficiently.

5 Claims, 4 Drawing Sheets

U.S. PATENT DOCUMENTS

2004/0205691 A1* 10/2004 Poole et al. ................ 717/100
2005/0081220 A1* 4/2005 Yodaiken et al. ........... 719/331
2005/0278683 A1* 12/2005 Roesner et al. ............... 716/18

* cited by examiner

METHOD FOR PARALLEL SIMULATION ON A SINGLE MICROPROCESSOR USING META-MODELS

CROSS-REFERANCE TO RELATED APPLICATION

The present application claims the benefit of a foreign priority application of Ser. No. EP 01111833.8 filed May 16, 2001.

BACKGROUND OF THE INVENTION

The present invention generally relates to hardware development and design, and in particular it relates to a method for simulating hardware.

Although the present invention has a very general scope which is independent of a specific hardware simulation method, it will be compared with a specific prior art, i.e. the hardware simulation of clocked designs in which so-called cycle simulation is used for performance reasons.

In such prior art hardware simulation methods, said cycle simulation implies that the logical behavior of the hardware will be compiled to an executable program that is computed once for every simulation cycle. In general, the performance for such a prior art simulator program is linear to the size of the design. When, for instance the design is duplicated in size an executable object results which is double as large as before and has thus only the half of the former performance. In cycle simulation programs, each Boolean expression of the hardware logic under development has to be compiled into code. This is generally done by looking for each individual bit and translating its Boolean expression into code.

Due to the fact that state-of-the-art computer processors can handle words (32 bit) or even double words (64 bit) at a time, the resulting code which is only using 1 bit per operation for the actual simulation work and which does not exploit for example the remaining 31 or 63 bit for simulation work, is very far from optimum.

In prior art hardware simulation systems, one and the same hardware model is simulated under a plurality of operation conditions which differ from each other by different stimuli. A stimulus is hereby meant to be understood as a general boundary condition of the underlying hardware model. Thus, it can be a different input vector, and often some variation in the initial setup of internal register or array occupancy.

Those models which are identical but differ in a plurality of input variables, are denoted further herein as different instantiations of the same hardware model.

A prior art approach intends to optimize cycle simulation by setting up so-called 'parallel instance features'. If the hardware design contains some identical pieces it is possible to use the code for one piece and reuse the remaining 31 bits as slices for up to 31 copies of the same original piece of hardware logic. If ever such a situation is present on the chip, this reduces the size of the executable file and therefore increases the performance of the simulation program. Unfortunately, this prior art approach is only efficient if multiple instances of the same piece of hardware are found in one design.

Said prior art approach to use multiple instances for simulation has at least two essential disadvantages. First, it works only in cases when multiple design copies are available in a given hardware circuit design. If this should not be the case—as it is very often—there are no possibilities to make the simulation faster. Second, whenever said 'multiple instances' approach is used for reusing code for a plurality of hardware pieces some extra, i.e. separate glue code, is required to connect said multiple instances properly to the rest of the hardware model. This, however represents quite a lot of work and results in considerable computing time consumption.

SUMMARY OF THE INVENTION

It is thus an object of the present invention to provide a method and system for simulation hardware model which is more efficient and saves computing time.

The basic approach of the present invention focuses the underlying technical problem from a more abstract point of view. According to the present invention, the saving of computing time does not result from the performance gain relating to a single test case, but instead, form the overall performance for a huge set of the test cases. In other words, instead of trying to speed up one simulation run, the present invention tries to achieve a respective greater speed up for a whole set of simulation runs.

The present invention exploits the fact that, for a set of test cases, the underlying hardware models are identical. According to the invention, instead of searching for copies of design pieces, the whole model itself is used to build up a so-called meta-model which consists of a plurality of copies of the same model, e.g. of 32 copies. Those copies, however, are just different instantiations of the same, underlying hardware model. Thus, the meta-model actually represents some kind of hardware which will never be produced, but which has an inner structure comprising a repeated sequence of logic pieces to be simulated in parallel. Thus, multiple tests can be simulated in parallel on one and the same microprocessor such that, for example the result of up to 32 simulation runs can be calculated in the same time which was required in prior art to calculate a single simulation run.

It should be noted that the only remaining overhead which cannot be parallelized is the so-called "environment code" which is not part of the hardware model, for example in form of C/C++ routines. In this way, a typical distribution of computing time for the simulation of one test case of 80% in model execution and 20% in execution of environment code, a number of 32 simulation runs can be speeded up according to the invention by a factor of approximately 4.5:

Before: $32 \times 0.8 + 32 \times 0.2 = 32$

Invention: $1 \times 0.8 + 32 \times 0.2 = 7.2$

The disclosed concept requires some changes in the model build process and the environment code has to be changed in a way to allow concurrency of the same code in parallel threads.

According to a first primary aspect, a method for simulating a hardware logic circuit using a hardware model and a simulation environment is disclosed in which stimuli of the simulation are built-up and simulation result data is managed. Said method is characterized by the steps of using a meta model compiled for integrating a plurality of n different instantiations of the same hardware model, and resolving facilities and signals of different instantiations by instantiation-specific name space specifications in a code switch means.

Thus, computing time is saved because by simulating the meta model the processor resources, for example, storage spaces, are utilized more efficiently.

When, additionally, a hardware description language (HDL) is used for the simulation environment, then the additional advantage results that a prior art hardware simulator program can be used for simulating the meta model and after simulation for retrieving the results associated with the specific instantiations of the hardware model.

Further, in case of no HDL in use, it is proposed to generate a test object for communicating with the meta model, to generate a "main( )" program calling a plurality of n different instantiations of identical simulation models. Then the disclosed concept is arranged for advantageously using a general purpose object-oriented programming language for the simulation environment.

When said above mentioned model-specific name space specifications are done by prefix or suffix name extensions of respective variables, an efficient way to distinguish between the different instantiations results.

Further, when providing the additional steps of:
a. associating each of a plurality of n input channels from said environment codes with a respective one of model instantiations for stimuli input purposes, and
b. associating each of a plurality of n output channels from said model instantiations with an invocation of a respective one of said environment codes, then an efficient code switch interface means is formed having two basic functions:
a. Feed the correct model instantiations with the corresponding stimuli data input in order to generally access the model and particularly to prepare the model instantiations to be executed, and
b. Take over the execution result data from said model instantiations and feed it to a respective environment code for result evaluation and issue.

When, additionally, monitoring events issued by the execution of model execution are provided to invoke a respective environment code responsive to such event, then the feature of prior art event monitoring is integrated advantageously into the disclosed concept.

According to its second primary aspect, a method for compiling a meta model of a hardware design source is disclosed comprising the steps of providing a facility for entering multiple instantiations of the same hardware simulation model with instantiation-specific name space specifications, compiling said multiple instantiations into a single executable or object file of one single meta model.

Thus, existing prior art modelbuild compilers may easily be extended by the above features and can then be used for building the time saving meta-models.

Basically, the disclosed concept can primarily be used for cycle-based simulation. It is, however, also applicable in event driven simulation systems.

BRIEF DESCRIPTION OF THE DRAWINGS

These and other objects will be apparent to one skilled in the art from the following detailed description of the invention taken in conjunction with the accompanying drawings in which.

DESCRIPTION OF THE PREFERRED EMBODIMENT

Figure 2:
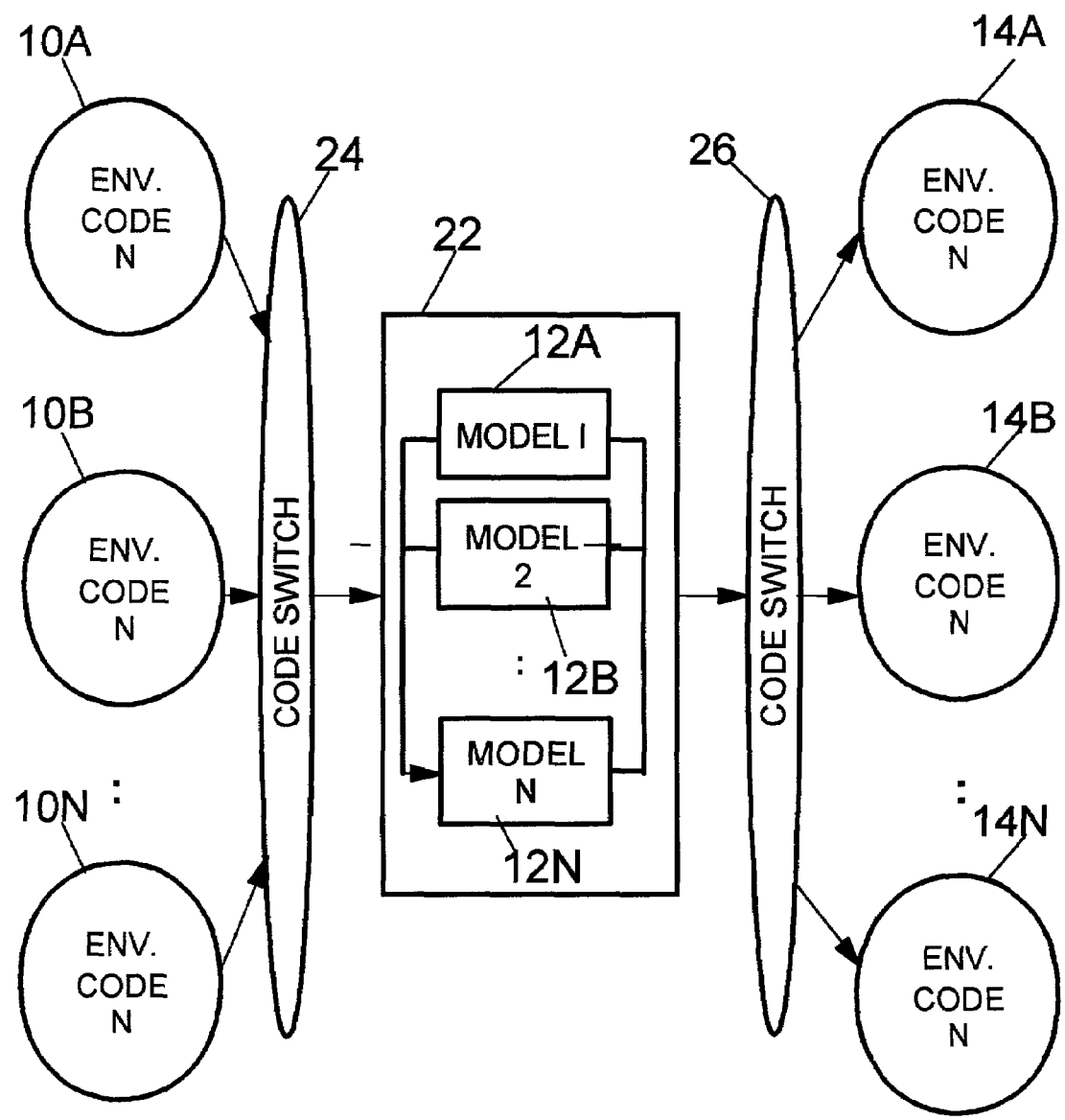
FIG. 2 is a schematic representation according to FIG. 1 illustrating the basic disclosed concept.

With reference now to FIG. 2, a preferred disclosed embodiment will be described in more detail with respect to cycle-based hardware simulation.

Figure 1:
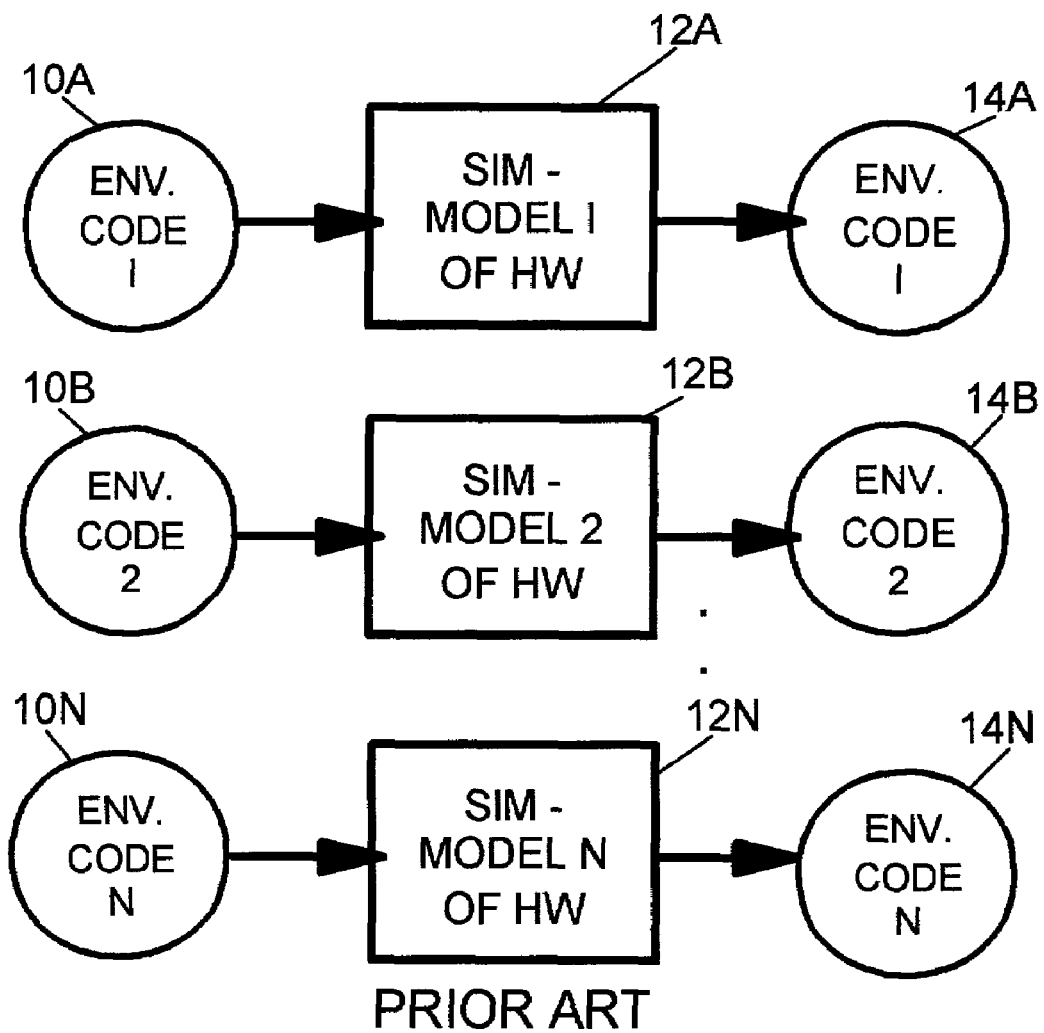
FIG. 1 is a schematic representation showing a structural overview of prior art hardware simulation with a plurality of n different hardware models.

The situation depicted in FIG. 2 is the same as that one depicted in FIG. 1, that is, a plurality of n hardware models each representing a specific instantiation with specific stimuli values of the same hardware model which is to be simulated. In order to do this, the stimuli values must be managed as well as the simulation results. These tasks are done by the environment code 10A, 10B, 10N and 14A, 14B, 14N as it was done in the prior art simulation method.

Also, the n different environment codes are depicted twice with a respective denotation as A, and B . . . N. It should be understood that the environment code is a piece of software which provides software input and output facilities as depicted in the drawing and required by the model simulation to be performed. Thus, input values are input for a simulation and simulation results are evaluated by each of a respective environment code.

According to the disclosed embodiment, however, within one single simulation run to be performed on a single microprocessor system, a plurality of n different instantiations of the same hardware model, preferably, are performed. This is done simulating a so-called meta-model 22 which integrates the before-mentioned plurality of n different model instantiations 12A, 12B, . . . 12N. Thus, said meta-model 22 does not represent a piece of hardware to be constructed in future, but instead, is a fictive one which serves just for collecting and integrating the simulation matter, i.e. calculation terms of the before-mentioned n different model instantiations.

How to build the meta-model 22 will be later referred to with reference to FIG. 3.

As reveals from FIG. 2 according to the preferred embodiment a so-called 'code switch interface' means 24 is provided having software means for associating each of the plurality of n input channels from each of a respective environment code with a respective one of model instantiations in order to input the above mentioned stimuli data into a respective hardware model instantiation.

The other part 26 of said code switch interface means takes over the execution result data from each of said model instantiations and feeds it to a respective environment code for result evaluation and issue.

The code switch software means is preferably polling the plurality of input channels in order to get input data as early as possible and is able to distinguish between different environment codes due to the different input channels.

According to a preferred embodiment a fixed prefix for model signal names and model facilities is now associated with each of said model instantiations 12A, 12B, . . . 12N. Thus, the code switch interface means 24 is able to take, for example stimuli data targeted to model instantiation 12B from the input channel belonging to environment code 10B. Applying such prefixes or alternatively, suffixes is an easy-to-implement way to integrate the different instantiations into the meta-model 22.

At the output side of the simulation, basically the same is done by the code switch part denoted with reference sign 26. In particular, the simulation result data is taken over from each of said models 12A, 12B, . . . 12N, the result data variable names which are provided with the same prefixes are evaluated and forwarded to a respective environment 14A, 14B, . . . 14N. Thus, having the fixed association between a model instantiation and a respective environment code, the complexity of the disclosed meta-model can be simplified and systematically processed by a simulator program.

Figure 3:
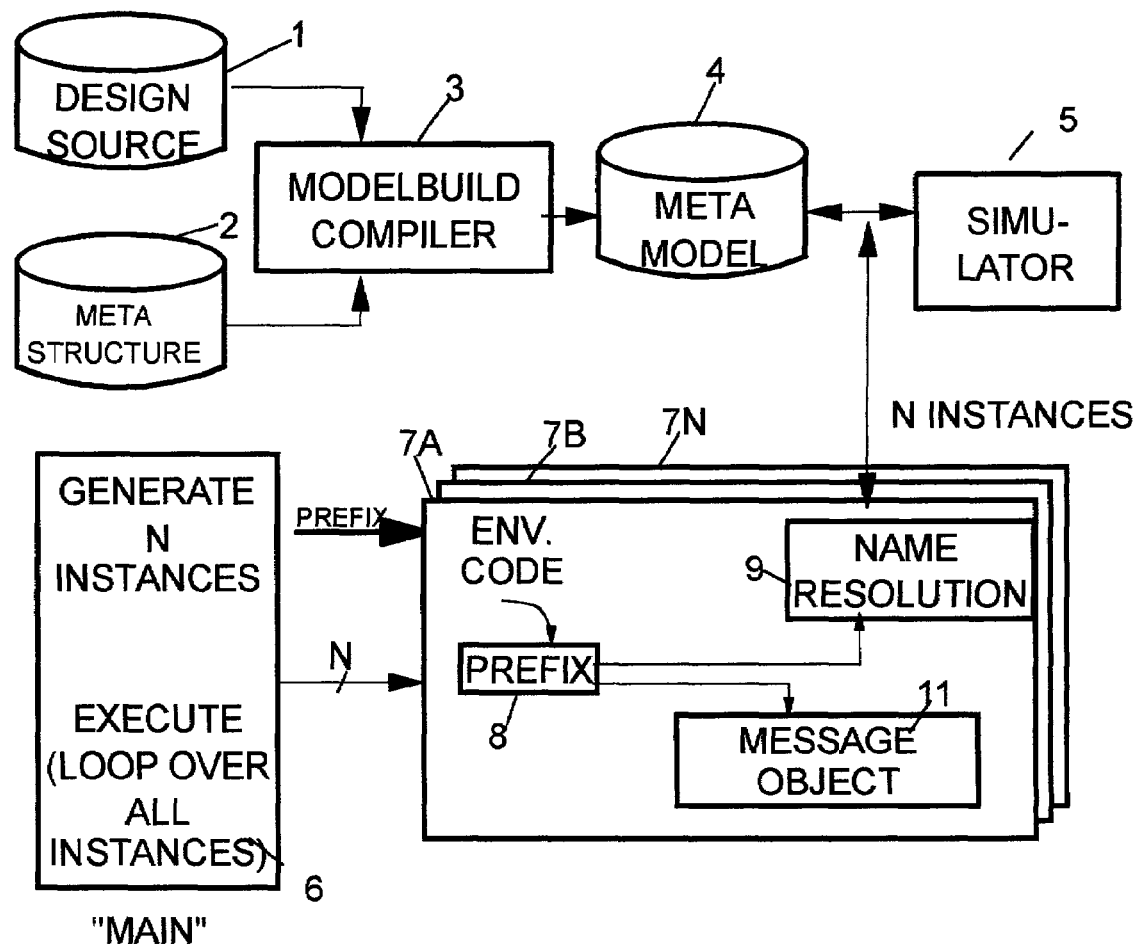
FIG. 3 is a schematic representation illustrating the disclosed model build compiler (upper part) and an disclosed embodiment of a simulator program (bottom part)

With reference now to FIG. 3, further details are given about building a respective inventive meta-model (upper part), and about how to implement the meta structure for the simulation environment (bottom part).

A hardware design source 1 contains the logical description of the design under development and is written in a hardware design language (HDL) such as VHDL or Verilog.

According to a preferred aspect of the present invention, the disclosed concept is able to be performed with the prior art modelbuild compiler 3 which only has to implement an additional feature or facility for entering multiple instantiations of the same hardware simulation model, preferably with instantiation-specific name space specifications for compiling said multiple instantiations into a single executable (file) of a thus produced meta-model. Thus, the modelbuild compiler 3 generates a machine executable format out of the design source 1 which may later be used together with the simulator program 5. Preferably, said compiler extension is done to a prior art modelbuild compiler which is capable of generating the above introduced 'parallel instance models'.

In order to be able to realize the key feature of the present invention—to use a meta-model by overlaying multiple models using the parallel instance feature of the simulator and model build compiler—first as a preparative step a so-called meta structure 2 is built up which enables the compiler to handle multiple independent models in said fictive meta structure. Said meta structure 2 essentially consists of the definition of a new and larger model which instantiates a plurality of copies of the original design source 1. An essential feature of the meta structure 2 is that for each of the original designs 1 a unique prefix is added to each of the facilities or signal names present in a design source in order to identify each instance in a meta-model 4 which is to be built up by the modelbuild compiler 3. For example, prefixes like mod.1, mod.2, mod.3 can be applied. Thus, a new hierarchy level is introduced by the present invention which represents a meta level because it does not represent any real hardware design under development. Said new meta level is used for the model build process and the compiler is thus able to build up this new model.

By virtue of said exemplary prefix naming convention, all signal names and other facilities in the original model will be prefixed with said unique individual prefix associated with a respective design instance such that, for example, an original signal des.1inter.reg will be modified to mod.1.des.1.inter.reg for the first instance of the design, or for the second instance it will be modified to mod.2.des.1.inter.reg, etc.

The meta-model 4 can then be used by a prior art simulator program which must, however, be provided with an disclosed code switch application programming interface (AP) for adapting the inventive concept.

With reference now to the bottom part of FIG. 3, the simulation environment is depicted schematically when used for the present invention. The environment is to be understood as a test bench for the simulation test cases in which stimuli data is generated and simulation results are checked. In general, this can be accomplished by using different programming languages. A preferred selection is, however, to use a hardware description language like VHDL or Verilog because the simulation environment is then a part of the design source 1 which simplifies the environment.

If, however, the simulation environment is coded in any general purpose object-oriented programming language like C++, for example, the environment contains a 'test object' which is responsible for the communication with the model, the test generation and for the checking and the logging of activities using a so-called message object 11. Further, a main( ) program 6 is required which instantiates the object and calls the object at appropriate times, repeatedly, when prior art simulation is used.

According to the invention, however, the situation depicted in FIG. 3, bottom part, illustrates the modified relationship between simulator and environment code. In particular, in environments which are coded in general purpose languages the environment has to be extended by the following mechanisms:

Instead of generating only one instance of a 'test object,' a main program 6 must generate n instances of the test object. It should be noted that the number of n must correspond to the number n of models integrated into the meta-model.

Further, in order to identify the instances, each object needs a prefix information 8 at the time of instantiation. This information is advantageously stored locally in the test object instance. Such an instance is depicted in FIG. 3 with reference sign 7A, 7B, 7N. This information is used at the beginning of the simulation run in order to resolve all model-related names, i.e. signal names and other facility names. This is preferably done by taking the base name, as for example des1.inter.reg and uses the stored prefix information to build the final model name, as for example mod.1.des1.inter.reg which then can be found in the model itself. This additional name specification or name extension needs to be done only at the start of the simulation because a pointer to the name returned by the simulator can then be used for further references to the same name. Said name resolution is symbolized with the box having the reference sign 9.

For environments which are coded in the same language as the hardware design source, such an extension of the simulation environment is not required. Thus, in such a case, it is sufficient to introduce the meta-model as described above for increasing the simulation throughput on a single computing resource.

Figure 4:
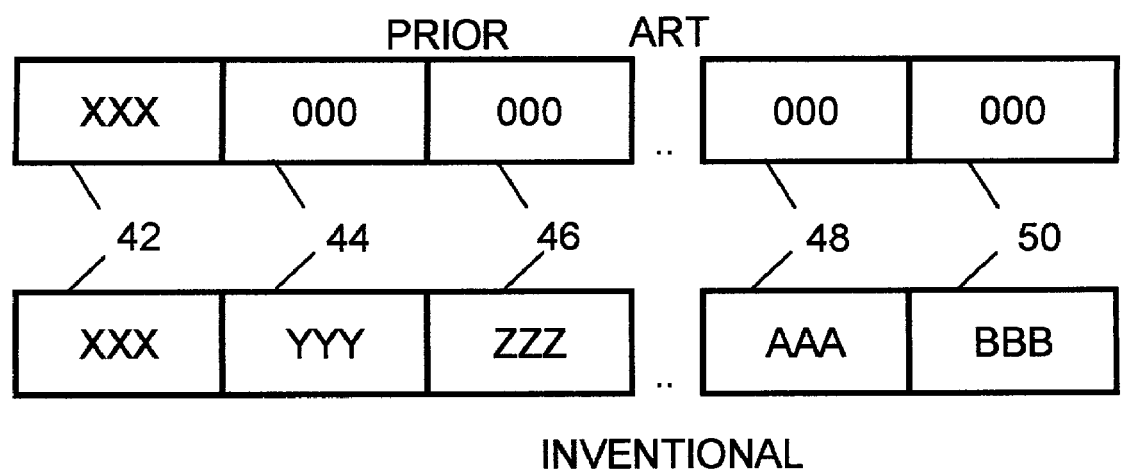
FIG. 4 is a schematic representation illustrating an exemplary storage representation for a specific variable name.

With reference to FIG. 4, an exemplary storage representation for a specific variable name, as mentioned above, is depicted. In the upper part of the figure, the prior art situation is depicted; in the bottom part, the disclosed situation. The storage snapshot comprises a plurality of memory sections 42, 44, 46, 48 and 50. In the prior art method, only section 42 is filled with an actual simulation value, whereas the rest of the fields, i.e. fields 44 to 50 remain empty and cannot be used for producing true simulation results.

According to the invention, in the specific case depicted in FIG. 4—bottom part—all of the remaining memory sections 44, 46, 48, 50 are filled with true simulation data whereby, for example, section 44 holds data associated with an additional model instantiation 12B, section 46 holds (different) data associated with model instantiation 12C, section 48 holds data associated with a further model instantiation and section 50 holds data with again a further model instantiation. Thus, as revealed in FIG. 4, the whole storage space present in a double word or quadword in the memory can be used instead of using only a small fraction of it, as in the prior art. This feature is mainly responsible for the performance gain obtained by the present invention.

It should be noted, that in situations in which a whole set of variable names does not fit into a single word, simply the next word is taken to be occupied by the subsequent data.

Thus, the present invention represents a large step forward to speed up hardware simulation.

In the foregoing specification the invention has been described with reference to a specific exemplary embodiment thereof. It will, however, be evident that various modifications and changes may be made thereto without departing from the broader spirit and scope of the invention as set forth in the appended claims. The specification and drawings are accordingly to be regarded as illustrative rather than in a restrictive sense.

The present invention can be realized in hardware, software, or a combination of hardware and software. A modelbuild compiler or a simulator tool according to the present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software could be a general purpose computer system with a computer program that, when being loaded and executed, controls the computer system such that it carries out the client or server specific steps of the methods described herein.

The present invention can also be embedded in a computer program product, which comprises all the features enabling the implementation the respective steps of the methods described herein, and which—when loaded in one or more computer systems—is able to carry out these methods.

Computer program means or computer program in the present context mean any expression, in any language, code or notation, of a set of instructions intended to cause a system having an information processing capability to perform a particular function either directly or after either or both of the following:

a) conversion to another language, code or notation;
b) reproduction in a different material form.

While the preferred embodiment of the invention has been illustrated and described herein, it is to be understood that the invention is not limited to the precise construction herein disclosed, and the right is reserved to all changes and modifications coming within the scope of the invention as defined in the appended claims.

What is claimed is:

1. A method for simulating a hardware logic circuit using a hardware model and a simulation environment test bench in which stimuli of the simulation are built-up and simulation result data is managed, the method comprising the steps of:

using a meta model compiled for integrating a plurality of n different instantiations of copies of the same hardware model for simulating multiple instances of the complete design with multiple instances of the test bench, which instantiations are identical but differ in a plurality of input variables, resolving facilities and signals of different instantiations by instantiation-specific name space specifications, running within one single simulation run on a single microprocessor system, said plurality of n different instantiations of the same hardware model, associating each of a plurality of n input channels from environment codes with a respective one of model instantiations for stimuli input purposes with a dedicated code switch, and associating each of a plurality of n output channels from said model instantiations with an invocation of a respective one of said environment codes with a respective code switch.

2. The method according to claim 1 comprising the steps of:

generating a test object for communicating with the meta model, and generating a main program calling a plurality of n different instantiations of identical simulation models.

3. The method according to claim 1 in which said model-specific name space specifications is done by prefix or suffix name extensions of respective variables.

4. The method according to claim 1 further comprising the steps of:

monitoring events issued by the execution of model execution, and invoking a respective environment code responsive to such event.

5. A method for compiling a meta model of a hardware design source comprising the steps of:

providing a facility for entering multiple instantiations of the same hardware simulation model for simulating multiple instances of the complete design with multiple instances of a test bench, which instantiations are copies of the hardware simulation model but differ in a plurality of input variables, with instantiation-specific name space specifications, compiling said multiple instantiations into a single executable or object file of one single meta model, running said single executable or object file within one single simulation run on a single microprocessor system, said multiple instantiations of said hardware simulation model, associating each of a plurality of n input channels from environment codes with a respective one of said instantiations for stimuli input purposes with a dedicated code switch, and associating each of a plurality of n output channels from said model instantiations with an invocation of a respective one of said environment codes with a respective code switch.

* * * * *